US010892006B1

(12) United States Patent
Penney et al.

(10) Patent No.: US 10,892,006 B1
(45) Date of Patent: Jan. 12, 2021

(54) WRITE LEVELING FOR A MEMORY DEVICE

(71) Applicant: Micron Technology, Inc., Boise, ID (US)

(72) Inventors: Daniel B. Penney, Wylie, TX (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/786,661

(22) Filed: Feb. 10, 2020

(51) Int. Cl.
*G11C 11/40* (2006.01)
*G11C 11/4096* (2006.01)
*G11C 11/4076* (2006.01)

(52) U.S. Cl.
CPC ...... *G11C 11/4096* (2013.01); *G11C 11/4076* (2013.01)

(58) Field of Classification Search
CPC .... G11C 11/4096; G11C 11/4076; G11C 8/18
See application file for complete search history.

(56) References Cited

U.S. PATENT DOCUMENTS

| 2012/0137084 | A1* | 5/2012 | Ok | G11C 7/1093 711/154 |
| 2014/0334243 | A1* | 11/2014 | Duffner | G11C 29/022 365/233.13 |
| 2018/0174633 | A1* | 6/2018 | Lee | G11C 7/222 |
| 2019/0122719 | A1* | 4/2019 | Kim | G11C 7/225 |

\* cited by examiner

*Primary Examiner* — Han Yang
(74) *Attorney, Agent, or Firm* — Fletcher Yoder, P.C.

(57) ABSTRACT

A memory device include write leveling circuitry that is configured to receive a write command from the command interface. The write leveling circuitry also receives a data strobe (DQS) signal from a host device (e.g., processor) and receives a clock signal from the host device. The write leveling circuitry also compares phases of the DQS signal and the clock signal using a phase detector. The write leveling circuitry also generates an internal write signal (IWS) based upon the write command, and outputs a captured result of a write leveling operation based at least in part on the compared phases and the IWS.

20 Claims, 5 Drawing Sheets

WRITE LEVELING FOR A MEMORY DEVICE

BACKGROUND

Field of the Present Disclosure

Embodiments of the present disclosure relate generally to the field of semiconductor devices. More specifically, embodiments of the present disclosure relate to modification of a write leveling signal using a modified internal write leveling cycle in memory devices.

Description of Related Art

Semiconductor devices (e.g., memory devices) utilize timing with phase shifts of data signals, data strobes, and/or other signals to perform operations. Data strobes are used to capture data. To ensure that the data strobe signals are timed properly to capture data signals in, write leveling may be used to adjust timing for the data strobe signals to ensure that the data signals are captured properly. The use of write leveling allows the system to compensate for timing differences on a module between the clock path to each memory device and data signals (DQ) and data strobe (DQS) paths. If write leveling is not accurate, timing differences may not be mitigated potentially causing the memory device to operate outside of specifications.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

To ensure that the data strobe (DQS) signals are timed properly to capture data signals (DQ), write leveling may be used to adjust the DQS signals. In some embodiments, write leveling may be employed at power-up of a memory device, during a clock change, and/or due to system-level decisions (e.g., when too much variation occurs on clocking and clocking is reset). Write leveling may be classified as external write leveling and/or internal write leveling. For instance, external write leveling and/or internal write leveling may use the techniques discussed in U.S. patent application Ser. No. 16/779,866, entitled "Write Leveling," which was filed on Feb. 3, 2020, and which is incorporated herein for all purposes.

External write leveling includes sending signals back to a host device indicating whether the DQS signals and clock signals are aligned at pins of the memory device. In other words, external write leveling is configured to align the DQS and CLK signals in phase at pins of the memory device. However, due to multiple sources of internal path matching error, the DQS and the CLK may become unaligned inside of the memory device after the external write leveling. Thus, some devices, such as dynamic random access memory (DRAM) double-data rate type 5 (DDR5) devices, may use internal write leveling to compensate for internal matching issues.

Internal write leveling may be completed subsequent to the external write leveling. Internal write leveling, for example, allows for a memory to shift a timing at which it launches an internal write command (e.g., an internal write signal (IWS)) to be captured by the DQS domain. Accordingly, internal write leveling utilizes IWS circuitry to launch the IWS after a write is received from the host device and may be performed using instructions from the host device. The internal write leveling causes the launch to occur some number (N) of cycles earlier than a programmed CAS (column access strobe) Write Latency (CWL) for the memory device to ensure that the internal DQS signal may capture the IWS properly.

A double data rate type five synchronous dynamic access memory (DDR5 SDRAM) device has a specification that includes internal write leveling inclusive of a final positive phase shift of a data strobe (DQS) signal by a host device. For example, following completion of both write leveling steps (external and internal leveling, i.e., the entire write leveling training process), the DDR5 specification allows for a timing offset (DQS to CLK phase alignment) of between −0.5 tCK (DQS minus a half clock pulse) and +0.5 tCK (DQS plus a half clock pulse), where tCK is the time for one tick of a clock (CK).

In devices, such as DRAM double-data rate type 4 (DDR4), where no internal write leveling is used, the external write leveling may have more stringent timing than internal leveling devices (e.g., DDR5) that use both internal and external write leveling. Specifically, during a sweep of an external write for internal leveling devices, the actual internal write signal may be captured for coarse timing adjust (e.g., aligning to the correct cycle), without fine adjustment. Accordingly, a fine tuning portion for fine adjustment of DQS to CLK may be bypassed and/or omitted from the internal leveling devices. For example, an associated path matching circuit may be eliminated for DDR5 external write leveling for fine adjustment. Since these internal paths may be relatively long compared to the CLK and DQS input paths, a significant source of internal timing error is removed from the timing alignment at the DRAM pins.

Figure 1:
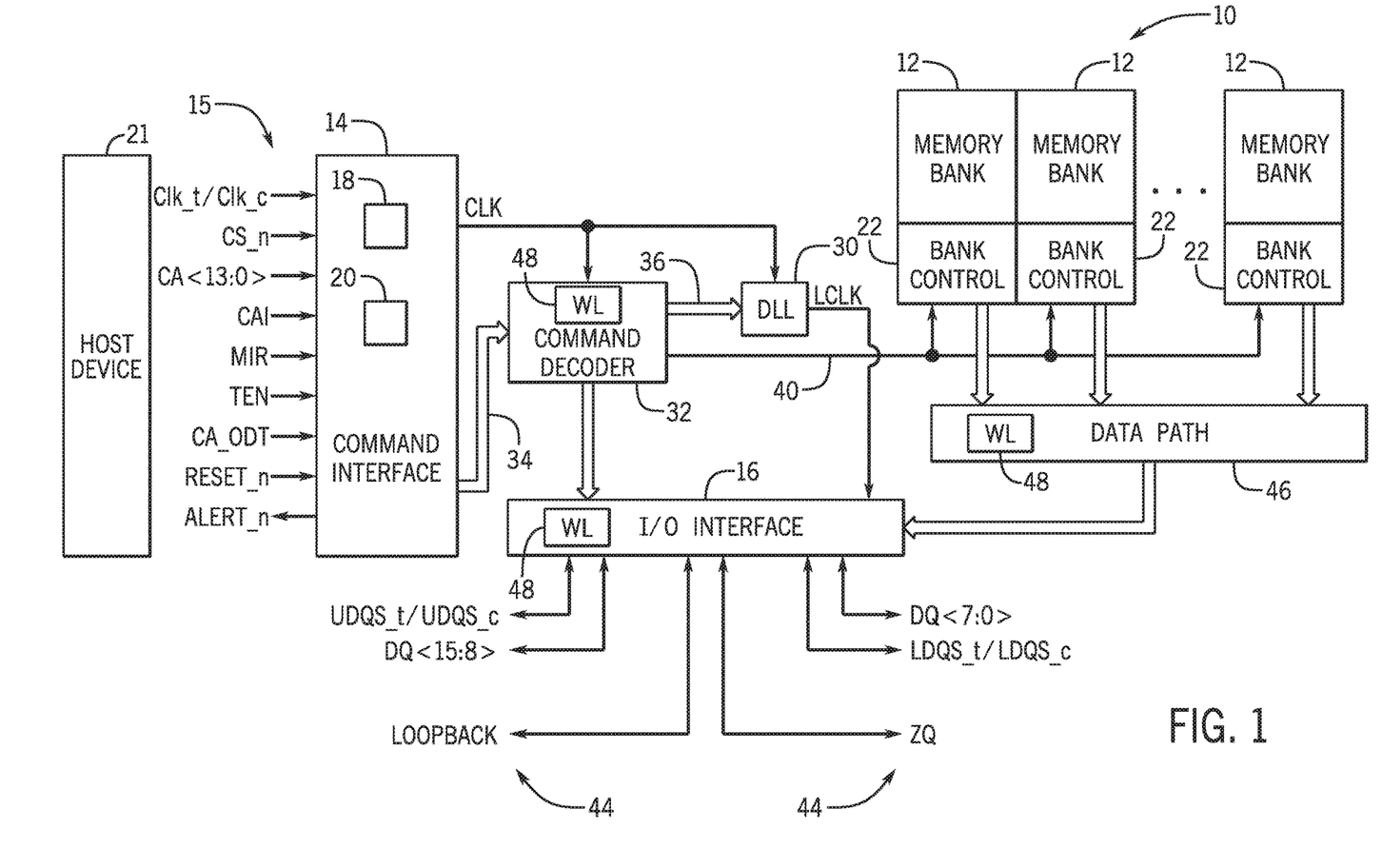
FIG. 1 is a simplified block diagram illustrating certain features of a memory device having write leveling circuitry, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15 from a host device 21. The host device 21 may include a processor and/or other device used to write data to and/or receive data from the memory device 10. For instance, the host device 21 may drive at least some operations of the memory device 10. The command interface 14 may receive one or more clock signals from an external device. Generally, double data rate (DDR) memory utilizes a differential pair of system clock signals, referred to herein as the true clock signal (Clk_t) and the bar clock signal (Clk_b). The positive clock edge for DDR refers to the point where the rising true clock signal Clk_t crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_b), the DQS signals may be provided as a differential pair of data strobe signals (DQS_t and DQS_b) to provide differential pair signaling during reads and writes. For certain memory devices, such as a DDR5 SDRAM memory device, the differential pairs of DQS signals may be divided into upper and lower data strobe signals (e.g., UDQS_t and UDQS_b; LDQS_t and LDQS_b) corresponding to upper and lower bytes of data sent to and from the memory device 10, for instance.

As illustrated in FIG. 1, the I/O interface 16, the command decoder 32, and/or the data path 46 may include write leveling (WL) circuitry 48 that may be used to implement the write leveling techniques discussed herein. An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
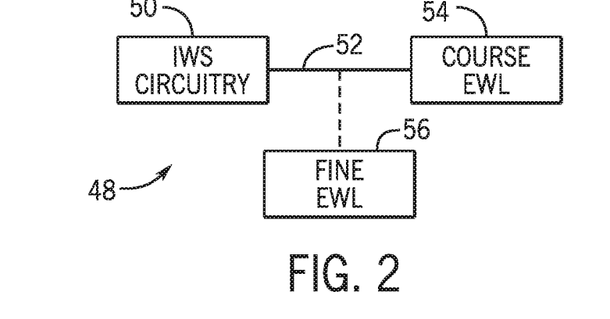
FIG. 2 is a block diagram of the write leveling circuitry of the memory device of FIG. 1 having internal write signal circuitry, coarse external write leveling circuitry, and fine external write leveling circuitry, according to an embodiment of the present disclosure.

FIG. 2 is a simplified block diagram of the WL circuitry 48 that may be implemented in the I/O interface 16, the command decoder 32, and/or the data path 46. As illustrated, the WL circuitry 48 may include internal write signal (IWS) circuitry 50 that is used to internalize a write signal that is received from the host device 21 via the command interface 14. For instance, the IWS circuitry 50 may capture the write signal and output an IWS 52.

The WL circuitry 48 may also include coarse external write leveling (EWL) circuitry 54 that may be used when an internal write leveling operation is set to occur after an external write leveling operation. For example, the coarse external write leveling may be used to ensure that both the DQS and the clock signals are aligned to corresponding cycles without regard to alignment within the cycle.

Additionally or alternatively, the WL circuitry 48 may include fine EWL circuitry 56 that may be used to perform external write leveling more precisely. For instance, the fine EWL circuitry 56 may be used when internal write leveling is not be used after external write leveling. Instead, in such embodiments, the fine EWL circuitry 56 more closely aligns the DQS and clock signals at the pins since internal write leveling may not be used to perform fine tuning of the DQS signal and clock signal alignment.

Figure 3:
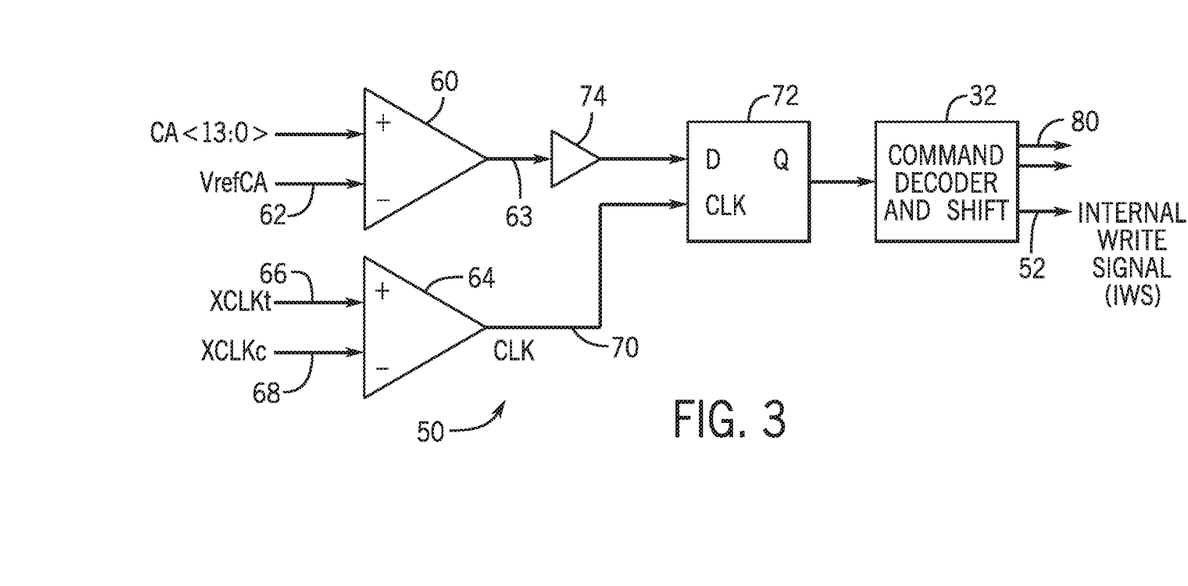
FIG. 3 is a schematic diagram of the internal write signal circuitry of FIG. 2, in accordance with an embodiment.

FIG. 3 is a schematic diagram of an embodiment of the IWS circuitry 50 of FIG. 2. As illustrated, the IWS circuitry 50 receives command address signals CA<13:0> via the command address bus from the host device 21 at an input buffer 60. In some embodiments, the input buffer 60 may receive a reference voltage 62. The input buffer 60 generates an internal command signal 63 based on the received CA<13:0>. In embodiments with the reference voltage 62 input to the input buffer 60, the internal command signal 63 output from the input buffer 60 is also based on the reference voltage 62.

The IWS circuitry 50 may also include an input buffer 64 that receives a clock signal 66 from the host device 21. In some embodiments, input buffer 64 may receive the clock using differential signaling. For instance, the input buffer 64 may receive clock signal 66 as a true clock (e.g., XClk_t) and a complementary clock signal 68 as a complementary clock (e.g., XClk_b). Using a differential signal or a single-ended signal, the input buffer 64 internalizes the received clock signal 66 to generate an internal clock 70. The internal clock 70 and the internal command signal 63 are transmitted to a flip flop 72. In some embodiments, the path used to transmit the internal clock 70 may be substantially longer than a path used to transmit the internal command signal 63. In such embodiments, a delay 74 may be inserted into the path of the internal command signal 63 to delay the internal command signal 63 to match the path of the internal clock 70.

The flip flop 72 receives the internal clock 70 and uses it to capture the internal command signal 63 in the flip flop 72. The flip flop 72 outputs the latched values to the command decoder 32 that decodes the received CA<13:0> and decodes a command type received from the host device 21. The command decoder 32 then outputs the IWS 52 to coarse EWL circuitry 54 and/or the fine EWL circuitry 56.

Figure 4:
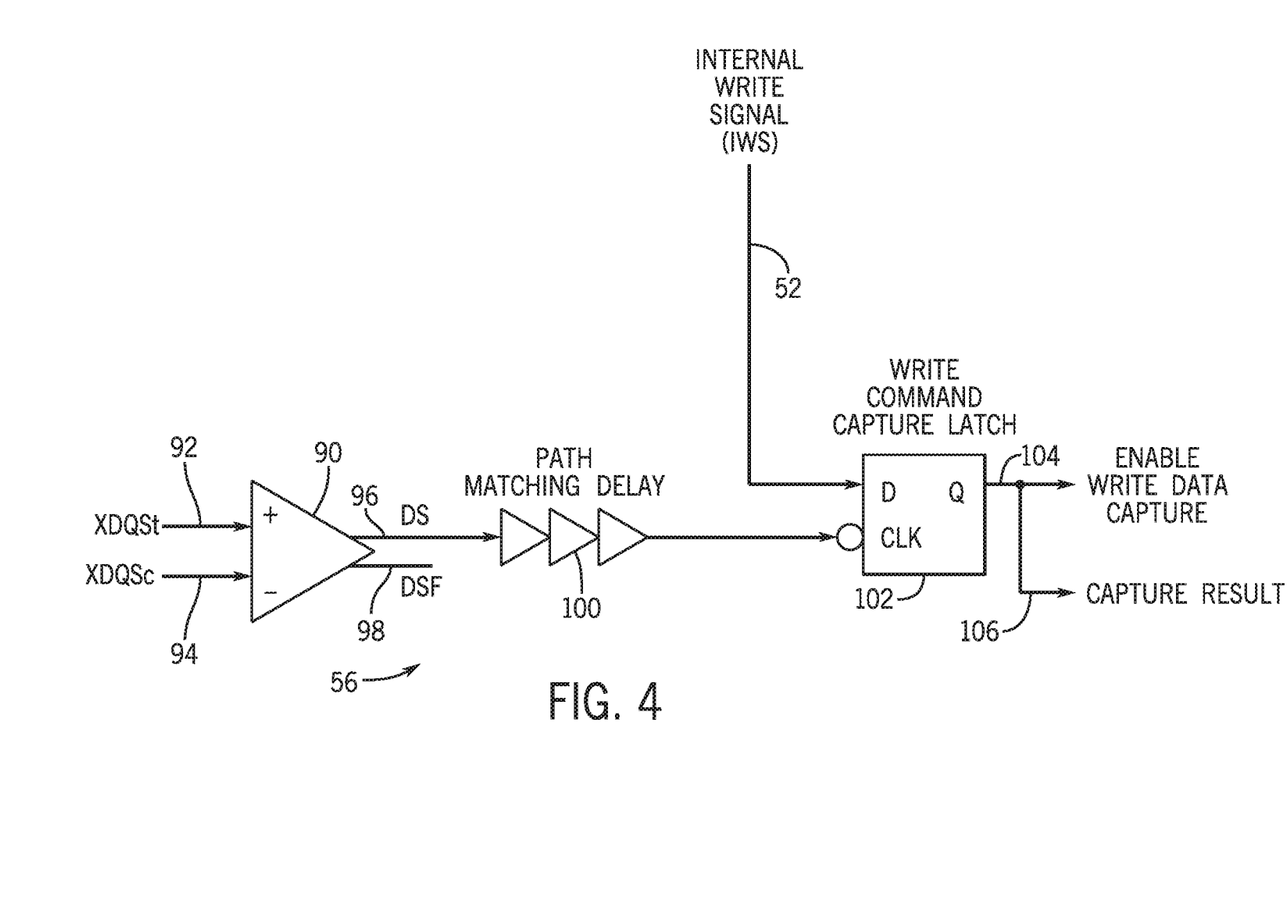
FIG. 4 is a schematic diagram of the fine external write leveling circuitry of FIG. 2, in accordance with an embodiment.

FIG. 4 is a schematic diagram of an embodiment of the fine EWL circuitry 56. As illustrated, the fine EWL circuitry 56 may include an input buffer 90 that receives differential external DQS signals 92 and 94 from the host device 21. In some embodiments, the input buffer 90 may receive a single-ended DQS signal. Regardless of whether the received DQS is differential or single-ended, the input buffer 90 outputs an internal data strobe (DS) signal 96. In some embodiments, the input buffer 90 also outputs a data strobe false (DSF) signal 98.

The fine EWL circuitry 56 may be used to perform external write leveling when no subsequent internal write leveling is to be performed. Accordingly, the fine EWL circuitry 56 may include a path matching delay 100 that is configured to align the IWS 52 to the internal DS signal 96 for flyby alignment to maximize a margin for a timing specified in a specification (e.g., DDR4 or DDR5). For instance, the specified timing may relate to a specification for a timing of a rising edge of DQS (e.g., tDQSS). The path matching delay 100 ensures that a flip flop 102 latches after or with the IWS 52 to ensure that latching of the IWS 52 occurs at a proper time to ensure that an enable write data capture 104 is output from the flip flop 102. This enable write data capture 104 may also be transmitted as a capture result 106 that is transmitted to a data (DQ) bus during external write leveling to enable the host device 21 to successfully complete external write leveling.

However, since the IWS 52 may be coarsely adjusted to mere alignment of the DQS to the correct cycle when internal write leveling is to occur for the memory device 10, the path matching delay 100 and the flip flop 102 may be omitted/bypassed when internal write leveling is to occur after the external write leveling. For instance, the fine EWL circuitry 56 may be used for DDR4 memory devices but omitted from DDR5 memory devices. Additionally or alternatively, DDR5 memory devices may include the fine EWL circuitry 56 and the coarse EWL circuitry 54 where the path matching delay 100 and the flip flop 102 are bypassed by using the coarse EWL circuitry 54 when an internal write leveling operation is to be performed after an external write leveling operation. Since these internal paths used for fine-tuned external write leveling are relatively long compared to the CLK and DQS input paths, these internal paths may be a significant source of internal timing error. Accordingly, bypassing or omission of these internal paths may remove a significant source of internal timing error at the pins of the memory device 10.

Figure 5:
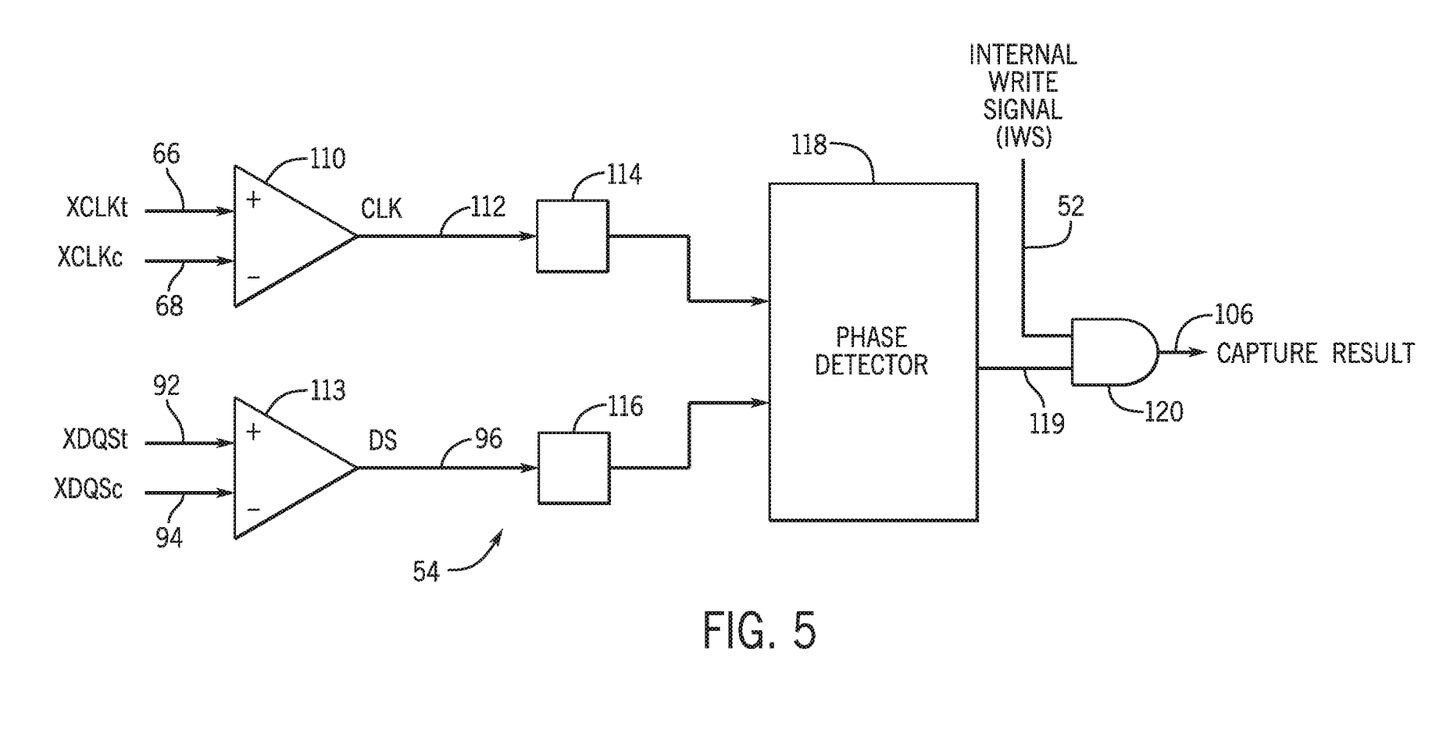
FIG. 5 is a schematic diagram of the coarse external write leveling circuitry of FIG. 2, in accordance with an embodiment.

FIG. 5 is a schematic diagram of an embodiment of the coarse EWL circuitry 54 that may be used in external write leveling operations before internal write leveling operations. As illustrated, the coarse EWL circuitry 54 may include an input buffer 110 that may be the same as or may function similarly to the input buffer 60 of FIG. 3. Specifically, the input buffer 110 may receive the clock signal 66 and the complementary clock signal 68 from the host device 21 and outputs an internal CLK signal 112.

The coarse EWL circuitry 54 may also include an input buffer 113 that is the same as or functions similarly to the input buffer 90. Specifically, the input buffer 113 receives external DQS signals 92 and 94 from the host device 21 and outputs the internal DS signal 96.

The coarse EWL circuitry 54 may include path matching circuitry 114 and/or 116 that may be used to match paths for the respective paths of the internal CLK signal 112 and the internal DS signal 96. Since the paths of the internal CLK signal 112 and the internal DS signal 96 are relatively short with respect to the paths used to capture the IWS 52, such path matching may include a relatively small delay with respect to the path matching delay 100 of the fine EWL circuitry 56 of FIG. 4.

The path-matched internal CLK signal 112 and the internal DS signal 96 are then transmitted to a phase detector 118 that generates an output signal 119 that represents a difference in the internal CLK signal 112 and the internal DS signal 96. This output signal 119 is then transmitted to an AND gate 120. The AND gate 120 gates the output signal 119 and the IWS 52 until both are received at the AND gate 120. As illustrated, the capture result 106 is controlled by the AND function of the IWS 52 and the output signal 119. The IWS 52 is used to detect when DQS aligns to a correct clock cycle relative to a cas write latency of the memory device 10.

Capturing the IWS 52 in the IWS circuitry 50 may use additional setup time compared to the coarse EWL circuitry 54. Accordingly, the additional setup time may be accounted for in the coarse EWL circuitry 54. For example, additional time may be built into the path matching circuitry 114 and/or 116 to compensate for such additional setup time.

In the foregoing discussion, the various components of the WL circuitry 48 may be distributed across portions (e.g., I/O interface 16, the command decoder 32, and/or the data path 46) of the memory device 10. Furthermore, at least some of the components (e.g., input buffers) may be shared between multiple components, such that a component (e.g., an input buffer) may provide a single to multiple different circuits. For example, the input buffer 90 may provide buffering of the external DQS signals 92 and 94 for the fine EWL circuitry 56 and the coarse EWL circuitry 54.

Figure 6:
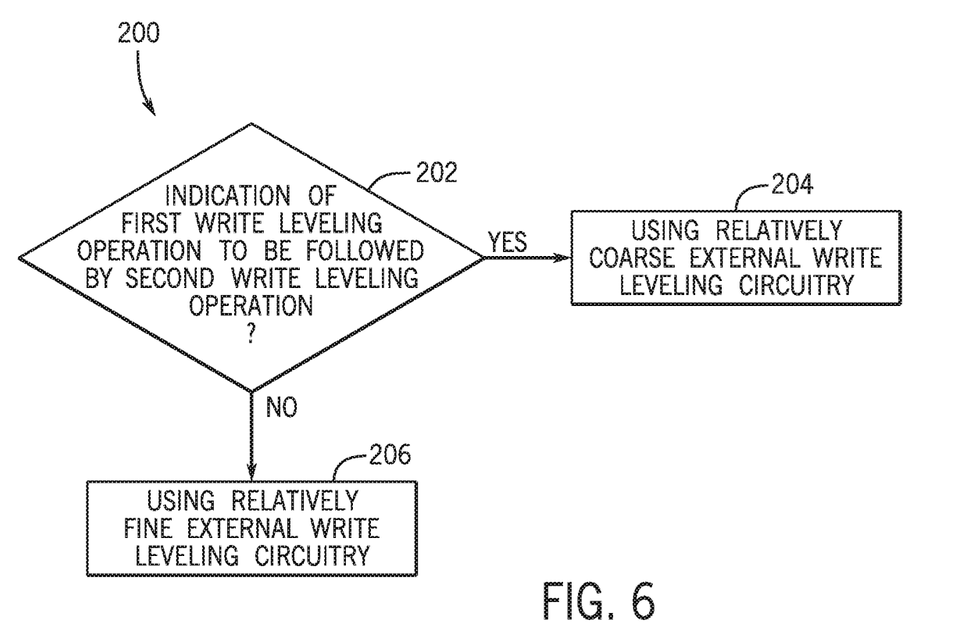
FIG. 6 is a flowchart of a process used by the write leveling circuitry of FIG. 2, in accordance with an embodiment.

FIG. 6 is a flow diagram of a process 200 that may be used by the WL circuitry 48. The process includes the memory device 10 receiving an indication of whether a first write leveling operation for a memory device is to be followed by a second write leveling operation (block 202). For instance, the indication may include a set value in a mode register of the memory device. For example, the mode register may be used to indicate whether the first write leveling operation (e.g., external write leveling) is to be followed by the second write leveling operation (e.g., internal write leveling). In other words, the mode register may indicate whether internal write leveling is enabled or disabled for the memory device 10.

Based on a determination that the second write leveling operation is to follow the first write leveling operation, the memory device uses a relatively coarse external write leveling circuitry 54 (block 204). Alternatively, based on a determination that the second write leveling operation is not to follow the first write leveling operation, using a relatively fine external write leveling circuitry 56 (block 206).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a command interface configured to receive a write command from a host device; and
write leveling (WL) circuitry configured to:
  receive the write command from the command interface;
  receive a data strobe (DQS) signal from the host device;
  receive a clock signal from the host device;
  compare phases of the DQS signal and the clock signal using a phase detector;
  generate an internal write signal (IWS) based upon the write command; and
  output an indication of a captured result of a write leveling operation based at least in part on the compared phases and the IWS.

2. The memory device of claim 1, wherein the WL circuitry comprises a latch, wherein generating the IWS comprises latching the write command in the latch.

3. The memory device of claim 2, wherein the WL circuitry comprises a command decoder, and wherein the generating the IWS comprises:
decoding the latched write command using the command decoder; and
outputting the IWS based at least in part on the decoded write command.

4. The memory device of claim 2, wherein the WL circuitry comprises:
a first input buffer configured to buffer the write command over a command address bus from the host device and to output the buffered write command to a data input of the latch; and
a second input buffer configured to buffer the clock signal from the host device and to output the buffered clock signal to a clock input of the latch to enable latching of the write command in the latch.

5. The memory device of claim 4, wherein the WL circuitry comprises a delay configured to delay the buffered write command to match timing of a path of the write command in the WL circuitry to a path of the clock.

6. The memory device of claim 1, wherein the indication of the captured result of the write leveling operation is based at least in part an AND operation of the IWS and an output of the phase detector.

7. The memory device of claim 1, wherein the WL circuitry comprises:

a first input buffer configured to receive and buffer the clock signal from the host device and to transmit the buffered clock signal to the phase detector; and
a second buffer configured to receive and buffer the DQS signal from the host device and to transmit the buffered DQS signal the phase detector.

8. The memory device of claim 7, wherein the WL circuitry comprises path matching circuitry configured to delay the buffered clock signal to match pathing of the buffered DQS signal.

9. The memory device of claim 1, wherein the WL circuitry comprises path matching circuitry configured to delay the buffered DQS signal to match pathing of the buffered clock signal.

10. A method, comprising:
receiving an indication of whether a first write leveling operation for a memory device is to be followed by a second write leveling operation;
based on a determination that the second write leveling operation is to follow the first write leveling operation, using relatively coarse external write leveling circuitry; and
based on a determination that the second write leveling operation is not to follow the first write leveling operation, using relatively fine external write leveling circuitry.

11. The method of claim 10, wherein the indication comprises a setting in a mode register of the memory device.

12. The method of claim 11, wherein the indication comprises the setting in the mode register indicating that write leveling is to be performed with an external write leveling as the first write leveling operation and an internal write leveling operation as the second write leveling operation.

13. The method of claim 10, wherein the first write leveling operation comprises an external write leveling pin configured to align a clock and data strobe at pins of the memory device.

14. The method of claim 10, wherein using the relatively coarse external write leveling circuitry comprises adjusting a data strobe (DQS) signal based on the first write leveling operation.

15. The method of claim 10, wherein using the relatively fine external write leveling circuitry comprises adjusting a data strobe (DQS) signal based on the first write leveling operation.

16. The method of claim 10, second write leveling operation comprises an internal write leveling configured to shift a launch of an internal write signal.

17. A memory device, comprising:
write leveling (WL) circuitry configured to shift a data strobe (DQS) received from a host device relative to a clock received from the host device, wherein the WL circuitry comprises:
  internal write signal (IWS) circuitry configured to use a received write command to generate an IWS; and
  external write leveling circuitry, comprising:
    a DQS input configured to receive the DQS from the host device;
    a clock input configured to receive the clock from the host device;
    a phase detector configured to output a phase signal indicative of a phase difference between the DQS and the clock; and
    an AND gate configured to perform an AND operation on the phase signal and the IWS.

18. The memory device of claim 17, wherein the DQS input comprises a DQS input buffer, and the clock input comprises a clock input buffer.

19. The memory device of claim 18, wherein the external write leveling circuitry comprises path matching circuitry configured to match a first path between the DQS input buffer and the phase detector with a second path between the clock input buffer and the phase detector.

20. The memory device of claim 17, wherein the IWS circuitry comprises:
- a latch configured to latch the received write command; and
- a command decoder configured to decode the received write command and output the IWS.

* * * * *